(12) United States Patent
Park et al.

(10) Patent No.: US 11,451,084 B2
(45) Date of Patent: Sep. 20, 2022

(54) ELECTRONIC DEVICE FOR HARVESTING POWER FROM AT LEAST ONE POWER SOURCE AND METHOD FOR OPERATING THE SAME

(71) Applicant: Samsung Electronics Co., Ltd., Suwon-si (KR)

(72) Inventors: Young-Jun Park, Suwon-si (KR); Jae-Hyun Park, Seoul (KR); Pradipta Patra, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 469 days.

(21) Appl. No.: 15/979,685

(22) Filed: May 15, 2018

(65) Prior Publication Data

US 2018/0337551 A1   Nov. 22, 2018

Related U.S. Application Data

(60) Provisional application No. 62/507,327, filed on May 17, 2017.

(30) Foreign Application Priority Data

Apr. 4, 2018   (KR) .................. 10-2018-0039071

(51) Int. Cl.
   *H02J 7/35*   (2006.01)
   *H02N 1/04*   (2006.01)
   (Continued)

(52) U.S. Cl.
   CPC ............... *H02J 7/35* (2013.01); *G04C 10/02* (2013.01); *H01L 31/02327* (2013.01);
   (Continued)

(58) Field of Classification Search
   CPC ...... H02J 7/35; H02J 7/14; H02J 7/345; H02J 50/001; H01L 31/02327; H01L 41/193;
   (Continued)

(56) References Cited

U.S. PATENT DOCUMENTS

2002/0027390 A1   3/2002  Ichiki et al.
2007/0119496 A1   5/2007  Baldo et al.
(Continued)

FOREIGN PATENT DOCUMENTS

CN   103457511 A   12/2013
CN   104682864 A    6/2015
(Continued)

OTHER PUBLICATIONS

Paik, Y., "Novel Photovoltaic Devices using Ferroelectric Material and Colloidal Quantum Dots", Feb. 2017, PhD dissertation, University of Miami, 168 pages total.
(Continued)

*Primary Examiner* — Rexford N Barnie
*Assistant Examiner* — Thai H Tran
(74) *Attorney, Agent, or Firm* — Sughrue Mion, PLLC

(57) ABSTRACT

Disclosed are electronic devices including a polymer including a ferroelectric and quantum dots disposed in the ferroelectric, at least one solar cell configured to receive light through the polymer and to convert the light into electrical energy, and a battery configured to be charged with the electrical energy from the at least one solar cell.

9 Claims, 11 Drawing Sheets

(51) Int. Cl.

| | | |
|---|---|---|
| *H02N 2/18* | (2006.01) | |
| *H02S 40/38* | (2014.01) | |
| *H01L 31/0232* | (2014.01) | |
| *G04C 10/02* | (2006.01) | |
| *H02S 10/10* | (2014.01) | |
| *H02J 7/14* | (2006.01) | |
| *H02S 10/40* | (2014.01) | |
| *H02S 40/32* | (2014.01) | |
| *H02S 50/00* | (2014.01) | |
| *G04G 19/00* | (2006.01) | |
| *H02J 7/34* | (2006.01) | |
| *H01L 41/193* | (2006.01) | |

(52) U.S. Cl.
CPC .............. *H02J 7/14* (2013.01); *H02N 1/04* (2013.01); *H02N 2/181* (2013.01); *H02S 10/10* (2014.12); *H02S 10/40* (2014.12); *H02S 40/32* (2014.12); *H02S 40/38* (2014.12); *H02S 50/00* (2013.01); *G04G 19/00* (2013.01); *H01L 41/193* (2013.01); *H02J 7/345* (2013.01)

(58) Field of Classification Search
CPC ... H01L 31/055; H01L 31/0547; G04C 10/02; H02S 10/10; H02S 10/40; H02S 40/32; H02S 50/00; H02S 40/38; H02N 1/04; H02N 2/181; H02N 2/18; G04G 19/00; Y02E 10/52
See application file for complete search history.

(56) References Cited

U.S. PATENT DOCUMENTS

| | | | |
|---|---|---|---|
| 2009/0085512 A1 | 4/2009 | Liang et al. | |
| 2010/0100149 A1* | 4/2010 | Wotherspoon | A61N 1/378 607/34 |
| 2010/0313957 A1 | 12/2010 | Zhao et al. | |
| 2012/0091810 A1 | 4/2012 | Aiello et al. | |
| 2013/0322140 A1 | 12/2013 | Park | |
| 2013/0328416 A1* | 12/2013 | Whitworth | H02J 50/30 307/149 |
| 2014/0000704 A1 | 1/2014 | Farahi | |
| 2014/0246908 A1* | 9/2014 | Chew | H02M 3/158 307/24 |
| 2014/0265601 A1* | 9/2014 | Orr | H01H 9/00 307/80 |
| 2014/0327313 A1* | 11/2014 | Arditi | H02J 3/38 307/63 |
| 2015/0075602 A1 | 3/2015 | Ozyilmaz et al. | |
| 2015/0075620 A1 | 3/2015 | Frantz et al. | |
| 2015/0115898 A1 | 4/2015 | Yung et al. | |
| 2015/0288179 A1 | 10/2015 | Pearson | |
| 2016/0156308 A1* | 6/2016 | Alon | H02S 10/00 136/244 |
| 2016/0233828 A1 | 8/2016 | Hwang et al. | |
| 2017/0117824 A1* | 4/2017 | Jiang | H02N 2/183 |
| 2017/0187187 A1* | 6/2017 | Amin | H02J 7/0029 |
| 2017/0353150 A1* | 12/2017 | Alon | H01R 4/4818 |

FOREIGN PATENT DOCUMENTS

| | | |
|---|---|---|
| CN | 206060339 U | 3/2017 |
| JP | 2002-78360 A | 3/2002 |
| KR | 10-2013-0035621 A | 4/2013 |
| KR | 10-2016-0061267 A | 5/2016 |
| KR | 10-2016-0098850 A | 8/2016 |
| WO | 2009/042368 A2 | 4/2009 |

OTHER PUBLICATIONS

International Search Report (PCT/ISA/210) dated Aug. 14, 2018, issued by the International Searching Authority in counterpart International Patent Application No. PCT/KR2018/005479.
Written Opinion (PCT/ISA/237) dated Aug. 14, 2018, issued by the International Searching Authority in counterpart International Patent Application No. PCT/KR2018/005479.
Communication dated Apr. 17, 2020, issued by the European Patent Office in counterpart European Application No. 18802557.1.
Communication dated Nov. 3, 2021, from The China National Intellectual Property Administration in Application No. 201880032445.4.
Communication dated Feb. 9, 2022, issued by the India Intellectual Property Office in Indian Patent Application No. 201947048574.

* cited by examiner

ELECTRONIC DEVICE FOR HARVESTING POWER FROM AT LEAST ONE POWER SOURCE AND METHOD FOR OPERATING THE SAME

CROSS-REFERENCE TO RELATED APPLICATION(S)

This application is based on and claims priority under 35 U.S.C. § 119 to U.S. Provisional Patent Application No. 62/507,327, filed on May 17, 2017, in the United States Patent and Trademark Office, and Korean Patent Application No. 10-2018-0039071, filed on Apr. 4, 2018, in the Korean Intellectual Property Office, the entire disclosure of which are incorporated herein by reference for all purposes.

BACKGROUND

1. Field

The following description relates to electronic devices and method for harvesting power from a power source.

2. Description of Related Art

Mobile or wearable electronic devices run various application programs and provide various functions for users' convenience. The mobile or wearable electronic device may include various pieces of hardware to provide various functions. By driving various pieces of hardware or running applications that require a high computation load, mobile or wearable electronic devices consume a significant amount of power.

With the mobile or wearable electronic devices becoming more compact in size, these devices may include a relatively small capacity battery. Soaring power consumption of these devices may accelerate the discharge of the embedded battery. Electronic devices may come with various types of power harvesting devices to address such issues. However, their relative low efficiency remains an issue. Electronic devices may have a solar cell. However, solar cells for mobile or wearable electronic devices suffer from a small light collecting area.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an device, including a polymer including a ferroelectric and quantum dots disposed in the ferroelectric, at least one solar cell configured to receive light through the polymer and to convert the light into electrical energy, and a battery configured to be charged with the electrical energy.

The device may include a converter configured to convert a voltage of the electrical energy from the at least one solar cell, and a switch configured to selectively connect the at least one solar cell and the converter.

The device may include at least one sensor configured to sense a magnitude of the electrical energy from the at least one solar cell, and at least one processor configured to control the switch to be on state or to be off state based on a comparison of the magnitude of the electrical energy with a threshold.

The processor may be configured to control the switch to turn on to allow the electrical energy from the at least one solar cell to be transferred to the converter, in response to the magnitude of the electrical energy exceeding the threshold.

The converter may be configured to buck-convert and to output the electrical energy received from the at least one solar cell.

The processor may be configured to control the switch to turn on to allow the electrical energy from the at least one solar cell to be transferred to the converter, in response to the magnitude of the electrical energy being less than the threshold and more than another threshold, and the converter may be configured to boost-convert and to output the electrical energy received from the at least one solar cell.

The device may include a capacitor configured to store the electrical energy from the at least one solar cell, and wherein the processor may be configured to control the switch to turn off to store the electrical energy from the at least one solar cell in the capacitor, in response to the magnitude of the electrical energy being less than the threshold and another threshold.

The device may include an energy converter configured to generate alternating-current (AC) electrical energy, a rectifying circuit configured to rectify the AC electrical energy from the energy converter into rectified electrical energy, a converter configured to convert the rectified electrical energy, and a summating circuit configured to summate the electrical energy from the at least one solar cell and the converted electrical energy.

The device may include a switch configured to selectively connect the summating circuit with the battery, and at least one processor configured to control the switch.

The device of claim 9, may include a storage capacitor configured to store the summated electrical energy from the summating circuit, in response to a magnitude of the electrical energy summated by the summating circuit being more than a threshold, and the processor may be configured to control the switch to turn off to allow the summated electrical energy from the summating circuit to be stored in the storage capacitor.

The processor may be configured to control the switch to turn on to allow the summated electrical energy from the summating circuit to be transferred to the battery, in response to a magnitude of the electrical energy summated by the summating circuit being less than a threshold.

The device may include a switch configured to selectively connect the rectifying circuit with the converter, and at least one processor configured to control the switch to turn on, in response to a magnitude of the rectified electrical energy exceeding a threshold.

The polymer may include a plurality of films stacked one over another, and each of the films comprising at least one quantum dot.

The device may include potential generating layers disposed on a top and a bottom surface of the polymer.

In another general aspect, there is provided a watch-type electronic device, including a housing, a display partially exposed to an outside through an opening formed in the housing, a polymer connected to the housing and shaped to be worn on a user's wrist, at least one solar cell configured to receive light through the polymer and to convert the light into electrical energy, and a battery disposed inside the housing and being configured to be charged with the electrical energy from the at least one solar cell.

The polymer may include a ferroelectric and quantum dots disposed in the ferroelectric.

The polymer may include a plurality of films stacked one over another, and each of the films comprising at least one quantum dot.

The watch-type electronic device may include a tribo-electric generator positioned on a surface of a second polymer shaped to be worn on a user's wrist and the tribo-electric generator being configured to generate tribo-electric energy based on friction with the user.

The watch-type electronic device may include a second polymer connected to the housing and shaped to be worn on a user's wrist, and another solar cell configured to receive light through the second polymer and to convert the light into electrical energy.

The watch-type electronic device may include a rotating body disposed along an outer circumference of the display and on a portion of the housing, the rotating body being rotatable with respect to the display, a frictional layer configured to cause friction against the portion of the rotating body, and an electrode configured to transfer tribo-electric energy generated by the friction between the frictional layer and the rotating body to the battery.

An electronic device, including energy converting modules, each of the energy converting modules configured to generate a respective pieces of electrical energy, at least one sensor configured to sense respective magnitudes of the pieces of electrical energy generated by the each of the energy converting modules, at least one converter configured to convert voltages of the pieces of electrical energy, switches, each of the switches configured to selectively connect one of the energy converting modules to one of the at least one converter, and at least one processor configured to receive the respective magnitudes of the pieces of electrical energy from the sensor, to identify whether each of the respective magnitudes of the pieces of electrical energy meets a respective one of a plurality of thresholds, each of the plurality of thresholds corresponding to a respective one of the energy converting modules, and to control an on/off operation of the each of the switches based on a result of the identification.

The electronic device may include a memory configured to store the plurality of the thresholds.

In another general aspect, there is provided method of manufacturing a polymer including quantum dots, the method including mixing a ferroelectric polymer and a quantum dot substance in a solvent to form a mixture, coating the mixture on a plate and thermally treating the coated plate, uniformizing the quantum dot substance in the mixture, coating the uniformized mixture as a thin film and thermally treating the thin film, and stacking the thermally treating thin film in layers, wherein each of the thermally treating thin film includes at least one quantum dot.

The ferroelectric polymer may include a first solution in which a P (VDF-TrFE) ferroelectric polymer is dissolved in a Dimethylformamide (DMF) solvent, the quantum dot substance may include a second solution in which Cadmium selenide (CdSe) is dissolved in a toluene solvent, and the uniformizing may include adjusting the composition of the solvents and the chemical potential.

The uniformizing may include adjusting the molecular bonding energy using sonication or adding a Methyl Ethyl Ketone (MEK) solvent.

Other features and aspects will be apparent from the following detailed description, the drawings, and the claims.

Figure 1A:
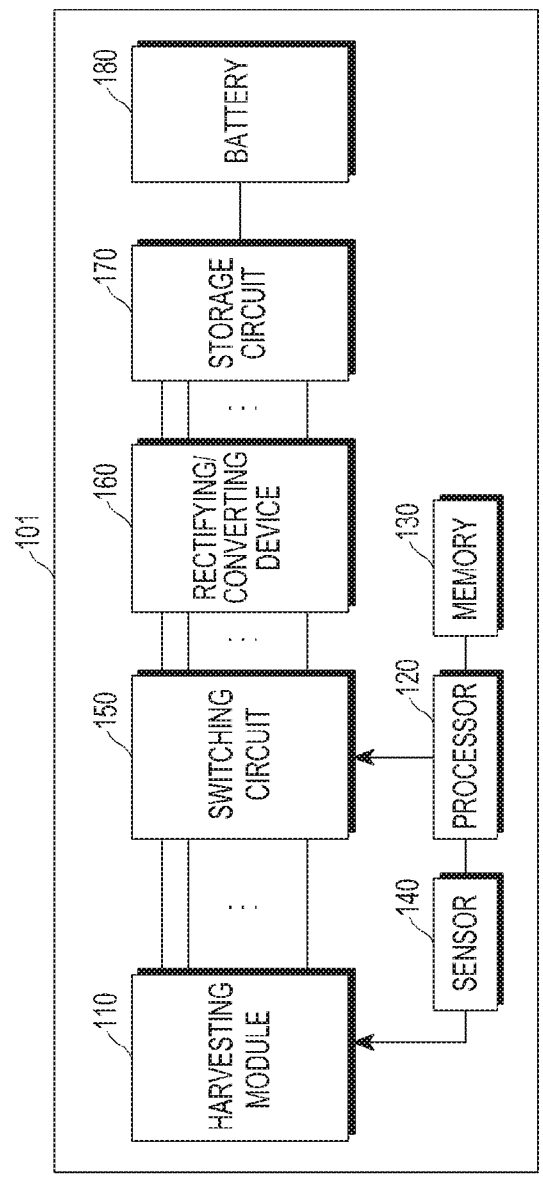
FIG. 1A is a diagram illustrating an example of an electronic device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Unless indicated otherwise, it will be understood that when a first element, such as a layer, region or wafer (substrate), is referred to as being "on," "connected to," "joined to" or "coupled to" a second element, it can cover both a case where the first element directly contacts the second element, and a case where one or more other elements are disposed between the first element and the second element. When an element is referred to as being "directly on," "directly connected to," or "directly coupled to" another element, there may be no elements or layers between the two elements. Likewise, expressions, for example, "between" and "immediately between" and "adjacent to" and "immediately adjacent to" may also be construed as described in the foregoing. As used herein, the term "and/or" includes any and all combinations of one or more of the associated listed items.

Words describing relative spatial relationships, such as "below", "beneath", "under", "lower", "bottom", "above", "over", "upper", "top", "left", and "right", may be used to conveniently describe spatial relationships of one device or elements with other devices or elements. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

Contents of the description regarding any one axial direction (x, y, or z axis) may also be applied in the same manner to any other axial direction. Such words are to be interpreted as encompassing a device oriented as illustrated in the drawings, and in other orientations in use or operation.

Terms such as first, second, third may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

The particular implementations shown and described herein are illustrative examples and are not intended to otherwise limit the scope of the present disclosure. For the sake of brevity, conventional electronics, control systems, software development and other functional aspects of the systems may not be described in detail. Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The electronic device may be one of various types of electronic devices, such as, for example, an intelligent agent, a mobile phone, a cellular phone, a smart phone, a server, a personal computer (PC), a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device, portable navigation device (PND), a handheld game console, an e-book, a high definition television (HDTV), communication systems, image processing systems, graphics processing systems, a kiosk, various Internet of Things (IoT) devices that are controlled through a network, other consumer electronics/information technology (CE/IT) device, or any other device capable of wireless communication or network communication consistent with that disclosed herein. The electronic device may be implemented in a smart appliance, an intelligent vehicle, an apparatus for automatic driving, a smart home environment, a smart building environment, a smart office environment, office automation, and a smart electronic secretary system.

The electronic device may also be implemented as a wearable device, which is worn on a body of a user. In one example, a wearable device may be self-mountable on the body of the user, such as, for example, a ring, a watch, a pair of glasses, glasses-type device, a bracelet, an ankle bracket, a belt, a band, an anklet, a belt necklace, an earring, a headband, a helmet, a device embedded in the cloths, or as an eye glass display (EGD), which includes one-eyed glass or two-eyed glasses. In another example, the wearable device may be mounted on the body of the user through an attaching device, such as, for example, attaching a smart phone or a tablet to the arm of a user using an armband, incorporating the wearable device in a cloth of the user, or hanging the wearable device around the neck of a user using a lanyard.

As used herein, the term "module" includes a unit configured in hardware and may interchangeably be used with other terms, e.g., "logic," "logic block," "part," or "circuit." A module may be a single integral part or a minimum unit or part for performing one or more functions. In an example, the module may be configured in an application-specific integrated circuit (ASIC).

FIG. 1A is a diagram illustrating an example of an electronic device.

Referring to FIG. 1A, an electronic device 101 includes a harvesting module 110, a processor 120, a memory 130, a sensor 140, a switching circuit 150, a rectifying/converting device 160, a storage circuit 170, and a battery 180.

In an example, the harvesting module 110 includes an energy conversion module or an energy converter capable of converting ambient energy into electrical energy. In an example, the harvesting module 110 includes a tribo-electric generator. The tribo-electric generator may include, for example, two materials having relative frictional polarization and electrodes. For example, electrical energy may be generated by a difference in electrification due to static electricity that occurs when the two materials come in contact or move away from each other. The electrical energy may be delivered through the electrodes to an external device. The harvesting module 110 may include a piezo effect generator. The piezo effect generator may include a piezo-electric substance with piezo-electric property. For example, where the piezo-electric substance is mechanically pressed, dielectric polarization may arise, meaning that positive charges and negative charges are separated. Thus, the charge density at the surface may be changed, causing electrical energy.

In an example, the harvesting module 110 includes a magnetic field converting module or a magnetic field converter. In an example, the magnetic field converting module include a coil for converting a magnetic field that is generated into electrical energy. For example, an induced electromotive force may be produced around the coil by variations in the magnetic field over time, inducing an electric current. In an example, the harvesting module 110 includes a photoelectric module. For example, the photoelectric module may include at least one solar cell and a diode constituted of a p-type semiconductor and an n-type semiconductor. As photons are incident from the outside to the at least one solar cell, electrons and holes are generated, thus generating electrical energy. In an example, the harvesting module 110 includes a thermoelectric generator. The thermoelectric generator may include a generator based on, for example, the seebeck effect or peltier effect. For example, when one of two contacting metal pieces is heated up, a temperature difference occurs, inducing electrical energy. In an example, the harvesting module 110 includes a radio frequency (RF) converting module or an RF converter. The RF converting module may include a coil for producing electrical energy using ambient radio waves. The above-described various modules or generators are merely an example, and other modules or generators are within the scope of the present disclosure. In an example, the harvesting module 110 may include at least one of the above-enumerated modules or generators or add other module or generator In an example, the processor 120 controls the operation of the electronic device 101. For example, the processor 120 may control the on/off operation of a switch included in the switching circuit 150 based on information obtained from the sensor 140. In an example, the switching circuit 150 includes at least one switch capable of selectively connecting the energy converting module in the harvesting module 110 to a converting module or a rectifying circuit in the rectifying/converting device 160. For example, the number of switches included in the switching circuit 150 may be the same or lesser than the number of energy converting modules in the harvesting module 110. In an example, the switches may be implemented as, for example, metal-oxide-semiconductor field-effect transistors (MOSFETs). However, other switches may be used without departing from the spirit and scope of the illustrative examples described.

In an example, the first ends of the switches in the switching circuit 150 are connected to the energy converting modules. When the switches are controlled to turn on, the energy converting modules connected to the switches may be connected to the rectifying/converting device 160. When the switches are controlled to turn off, the energy converting modules connected to the switches may not be connected to the rectifying/converting device 160. In an example, the processor 120 controls the on/off operation of the switches in the switching circuit 150 based on information received from the sensor 140. Thus, enabling charging at the optimal efficiency.

In an example, the processor 120 controls the switching circuit 150 based on any one or any combination of information received from the sensor 140 and on/off control rules stored in the memory 130. In an example, the sensor 140 measures the magnitude of electrical energy output from the energy converting modules of the harvesting module 110. For example, the sensor 140 may measure at least one of the voltage, current, power, or impedance at the end of the energy converting module. In an example, the memory 130 stores information about a threshold corresponding to each energy converting module. Table 1 exemplifies the threshold information stored in the memory 130.

TABLE 1

| Energy converting module | Threshold (V) |
| --- | --- |
| tribo-electric generator | 10 |
| piezo effect generator | 3 |
| photoelectric module | 3 |
| magnetic field converting module | 3 |

Although the thresholds are set in volts in Table 1 above, this is merely an example. For example, the thresholds may also be set in the units of the types sensed by the sensor (e.g., the unit of power, current, or impedance) or may be set for a plurality of types.

In an example, the processor 120 compares the voltage at the output end of each energy converting module in the harvesting module 110 identified from the sensor 140 with its corresponding threshold. In an example, the threshold is as per the information, for example, information shown in Table 1, stored in the memory 130. The processor 120 may connect the energy converting module, the voltage at the output end of which exceeds its corresponding threshold, to the rectifying/converting device 160. The processor 120 may control the switch connected to the energy converting module, the voltage at the output end of which exceeds the corresponding threshold, to turn on. The processor 120 may control the switch connected to the energy converting module, the voltage at the output end of which is not more than the corresponding threshold, to turn off. Accordingly, energy converting modules that cannot output a sufficient magnitude of voltage may be avoided from connecting to the rectifying/converting device 160 while only energy converting modules capable of outputting a sufficient magnitude of voltage may be connected to the rectifying/converting device 160. In an example, the threshold may previously be set as a magnitude at which power collected and charged may be larger than power used in the operation of the rectifying/converting device 160.

In an example, the whole or part of the processor 120 is electrically or operably combined or connected with other components (e.g., the memory 130, the sensor 140, or the switching circuit 150) of the electronic device 101. In an example, the processor 120 is configured of one or more processors. For example, the processor 120 may include an application processor to control higher layer programs, such as applications or a communication processor to control communication with other electronic devices. In an example, the switching circuit 150 is controlled even when the processor 120 is in a sleep mode in which case the sensor 140 may further include a computation circuit capable of controlling the on/off the switches of the switching circuit 150. In an example, the sensor 140 is referred to as a sensor hub. In an example, the electronic device 101 includes a logic circuit, such as, for example, a field-programmable gate array (FPGA), capable of controlling the on/off the switching circuit 150. In this case, the logic circuit may include various comparators. In an example, switch control signals are output from the switching circuit 150 depending on results of comparison between various thresholds, as set forth in Table 1, applied to first input ends of the comparators and voltages output from the energy converting circuit of the harvesting module 110 or sensor 140 connected to second input ends of the comparators.

In an example, the rectifying/converting device 160 includes a rectifying circuit or at least one converting circuit. For example, the energy converting circuit of the harvesting module 110, which produces alternating current (AC) electrical energy, may be connected to the rectifying circuit of the rectifying/converting device 160. The rectifying circuit may rectify AC electrical energy received from the energy converting module into direct current (DC) electrical energy and may output the DC electrical energy. The rectifying circuit may be connected to a DC/DC converter. The rectified electrical energy may be conveyed to the DC/DC converter. The DC/DC converter may convert the rectified electrical energy into a voltage required to charge the battery

180. For example, the energy converting circuit of the harvesting module 110, which produces DC electrical energy, may be directly connected to the DC/DC converter of the rectifying/converting device 160. The DC/DC converter may convert the voltage of the electrical energy received from the energy converting circuit into a voltage required to charge the battery 180. In an example, each DC/DC converter, or rectifying circuit, is connected to a corresponding energy converting modules of the harvesting module 110. In an example, at least two of the energy converting modules in the harvesting module 110 may share one rectifying circuit or one DC/DC converter.

In an example, the storage circuit 170 may summate electrical energy output from at least one DC/DC converter included in the rectifying/converting device 160. The storage circuit 170 may also store the summated electrical energy. In an example, a switch (not shown) may be added between the storage circuit 170 and the battery 180. When the switch (not shown) is on, the summated electrical energy may be delivered to the battery 180. When the switch (not shown) is off, the electrical energy may be summated and stored in the storage circuit 170. When the voltage of the electrical energy stored in the storage circuit 170 exceeds a threshold, the processor 120 may control the switch (not shown) to turn on. In an example, the electronic device 101 includes a battery charging controller to control the charging of the battery 180 in which case the battery charging controller may control the on/off the switch connected from the storage circuit 170 to the battery 180.

Figure 1B:
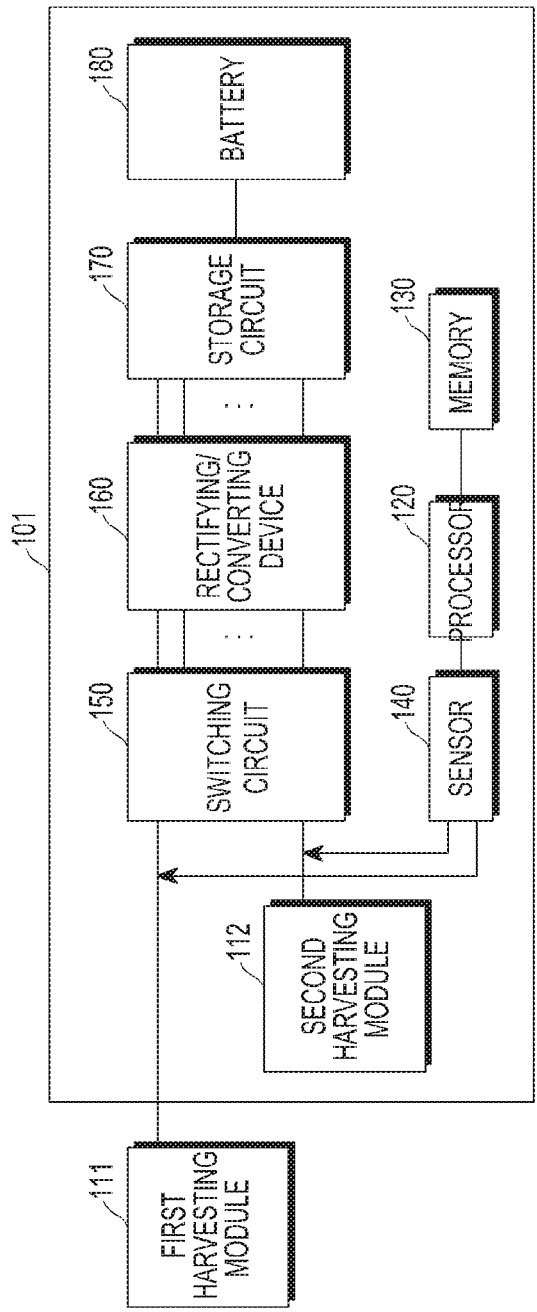
FIG. 1B is a diagram illustrating an example of an electronic device.

FIG. 1B is a diagram illustrating an example of an electronic device. In an example, the electronic device 101 includes a second harvesting module 112. The second harvesting module 112 is connected to an external first harvesting module 111. The electronic device 101 may include a housing. In an example, the second harvesting module 112 is positioned inside the housing or at least partially exposed through an opening formed in the housing. In an example, the electronic device 101 is electrically connected to the first harvesting module 111 that is included in an external accessory. For example, where the electronic device 101 is implemented as the head of a watch-type electronic device, the first harvesting module 111 may be included in a strap connected with the head. The head may include a housing having at least one hardware device. Some hardware devices may be partially exposed to the outside through the opening of the housing. For example, the hardware devices, such as a display, an antenna, or a microphone, may be partially exposed through the opening of the housing.

In an example, the sensor 140 detects a voltage at one output end of the first harvesting module 111 or the second harvesting module 112 and deliver sensing information to the processor 120. The processor 120 may compare the sensing information with threshold information stored in the memory 130, and based on a result of the comparison, the processor 120 may control the on/off each switch in the switching circuit 150. In some cases, the electronic device 101 may be interpreted as including both the head and the accessory in which case, the first harvesting module 111 may be appreciated to be outside the housing.

Figure 2A:
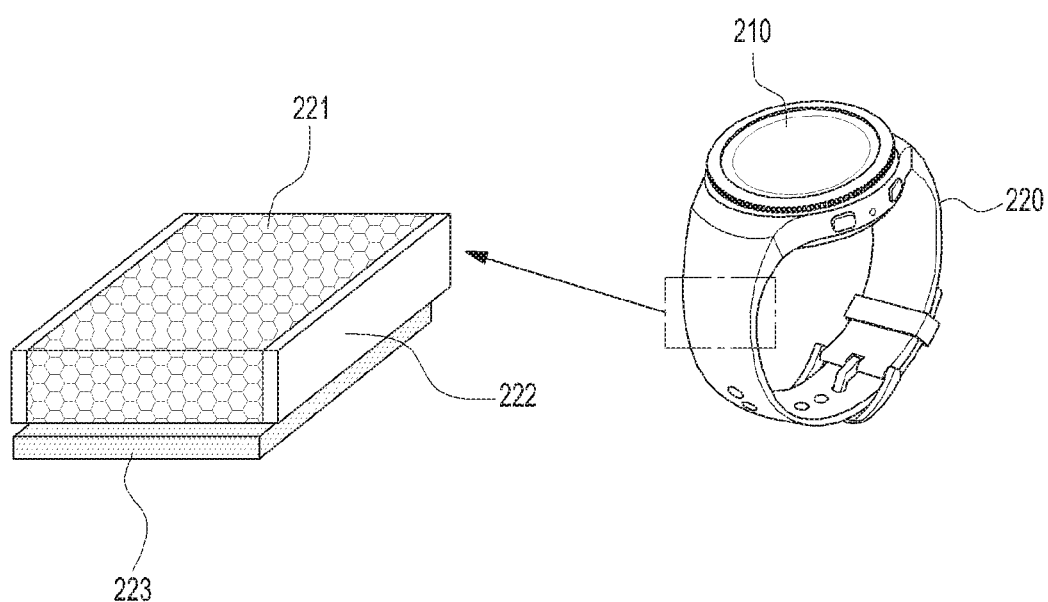
FIGS. 2A and 2B are diagrams illustrating examples of an electronic device and an accessory.
Figure 2B:
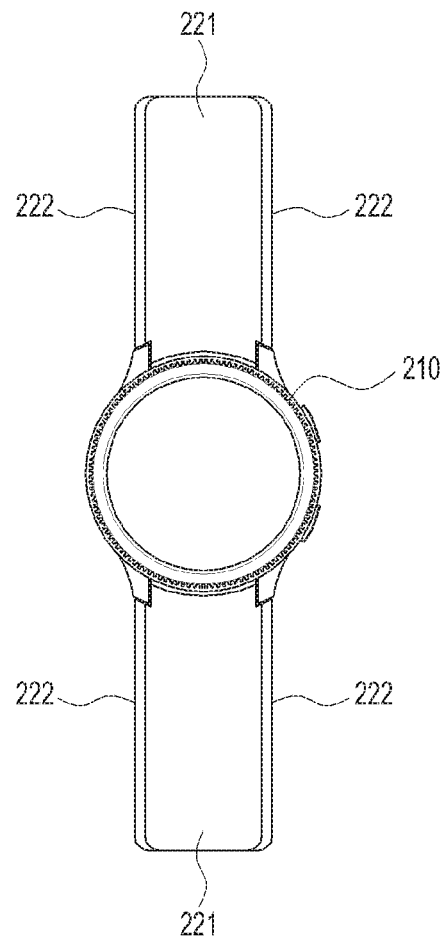

FIGS. 2A and 2B are diagrams illustrating examples of an electronic device and an accessory.

Referring to FIGS. 2A and 2B, an electronic device 210 may be implemented as a head of a watch-type electronic device. The electronic device 210 may be connected to a strap 220. The strap 220 may include a polymer 221, solar cells 222, and an energy converting layer 223. The polymer 221 may be formed of a material capable of transferring external light to the solar cell 222. The polymer 221 may be disposed to take up a relatively broad area of the strap, and to increase the light collecting area. In an example, the polymer 221 includes quantum dots. The quantum dots may raise the light transfer efficiency, which is further described below. The polymer 221 may include materials such as, for example, polyvinylidene fluoride (PVDF) or its derivative, and may include a ferroelectric having polarization on its own without an external electric field.

In an example, as shown in FIG. 2B, the solar cells 222 is disposed on both ends of the polymer 221 as viewed from above the strap 220. The solar cells 222 may convert light transferred through the polymer 221 or light directly received into electrical energy and deliver the electrical energy to the electronic device 210. The solar cells 222 are not limited to a particular type. Electrical energy generated from the solar cells 222 may be delivered to the electronic device 210. Thus, a power interface capable of transferring power may be disposed between the solar cells 222 and the electronic device 210. Although FIGS. 2A and 2B illustrate an example where the solar cells 222 are positioned in the strap, which is outside the electronic device 210, this is merely an example. For example, the solar cells 222 may be positioned in the electronic device 210 in which case the strap may be implemented to include the polymer 221.

In an example, the energy converting layer 223 may be placed under the polymer 221. The energy converting layer 223 may include a generator such as, for example, a triboelectric generator or a piezo effect generator. In an example, the energy converting layer 223 is disposed under the strap, allowing the energy converting layer 223 to contact the user, such as, at the user's wrist. By friction between the user's wrist and the energy converting layer 223, at least one of the tribo-electric generator or the piezo effect generator may output electrical energy, which is delivered to the electronic device 210. In an example, a power interface capable of transferring power may be disposed between the energy converting layer 223 and the electronic device 210.

Hence, when the user puts the strap 220 on her wrist, electrical energy generated by the energy converting layer 223 and the solar cells 222 in the strap 220 may be delivered to the electronic device 210. The electronic device 210 may work or charge the internal battery 180 using the electrical energy. As the polymer 221 for receiving light is disposed on the overall strap, relatively more photons may be converted into electrical energy.

Figure 2C:
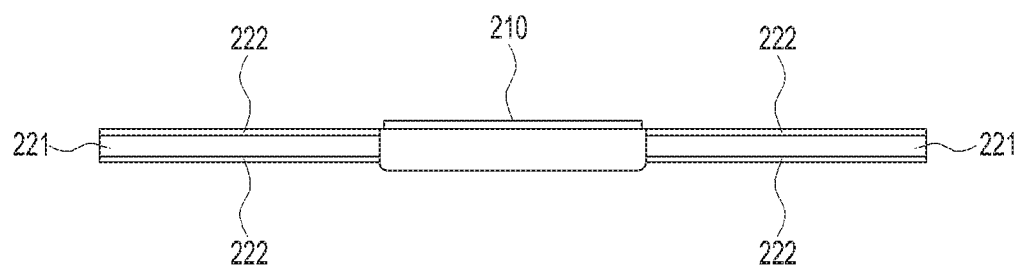
FIG. 2C illustrates an example of an electronic device and an accessory.

FIG. 2C illustrates an example of an electronic device and an accessory. Referring to FIG. 2C, unlike in FIGS. 2A and 2B, solar cells 222 may be disposed on the top and bottom, but not on the sides, of the polymer 221. Although not shown, an energy converting layer 223 may be placed in contact with the solar cells 222.

Figure 3:
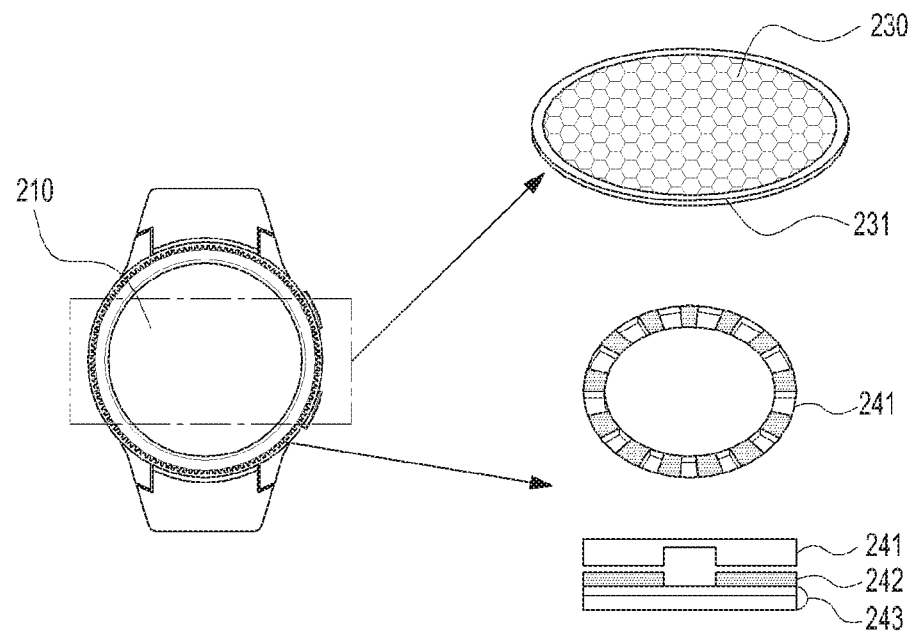
FIG. 3 is a diagram illustrating an example of an electronic device.

FIG. 3 is a diagram illustrating an example of an electronic device.

In an example, an electronic device 210 may include a display and a polymer 230 and a solar cell 231 on the display. In an example, the polymer 230 may be disposed on the display, and the solar cell 231 may be disposed along the edge of the polymer 230. Light incident through the polymer 230 may be transferred to the solar cell 231. In an example, the electronic device 210 may receive electrical energy from the solar cell 231 and the polymer on the display while also receiving electrical energy from the solar cell 231 in the strap.

In an example, a rotating body 241 is disposed along the outer circumference of the display. In an example, the rotating body 241 is disposed on a portion of the housing to be rotatable with respect to the display. The electronic device 101 may identify at least one of the direction or degree of rotation of the rotating body 241 and operate based on the identified information. In an example, electrical energy is produced by friction between the bottom of the rotating body 241 and a frictional layer 242. The electrical energy may be transferred through an electrode 243 to the electronic device 210.

Although not shown, in an example, the electronic device 210 includes a rotatable crown. The electronic device 210 may include the crown and a frictional layer to obtain electrical energy that is produced between the crown and the frictional layer as the crown is rotated.

Figure 4:
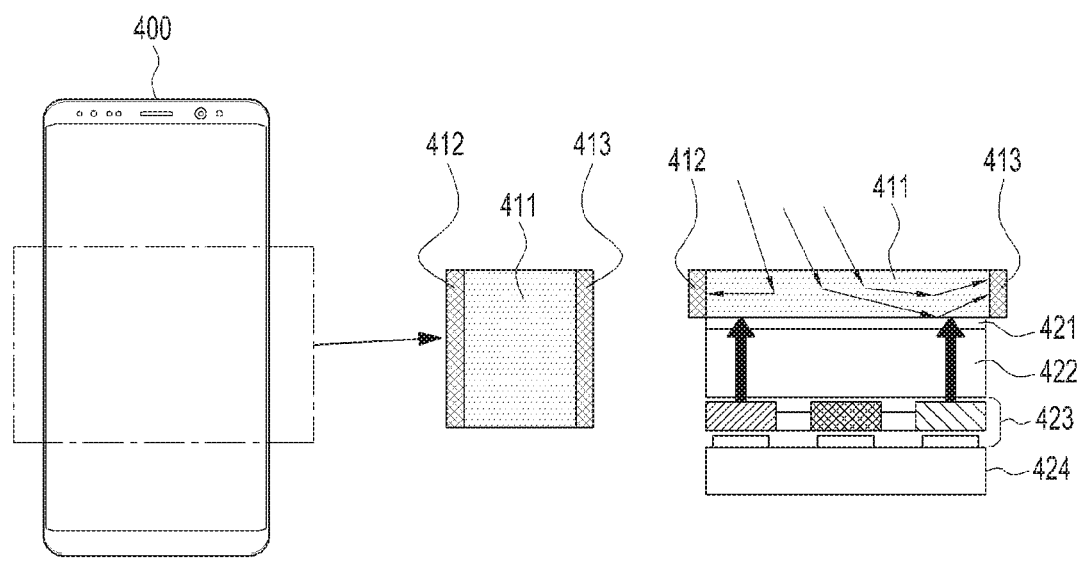
FIG. 4 is a diagram illustrating an example of an electronic device.

FIG. 4 is a diagram illustrating an example of an electronic device.

Referring to FIG. 4, an electronic device 400 is implemented as a smartphone. In an example, a polymer 411 and solar cells 412 and 413 are disposed on the display of the electronic device 400. In an example, a light emitting layer 423 is disposed on a glass 424, and a glass 422 and a polarizing layer 421 are disposed on the light emitting layer 423. The polymer 411 may be disposed on the polarizing layer 421, and the solar cells 412 and 413 may be disposed on both ends of the polymer 411. In an example, the polymer 411 is formed of a transparent material. Photons coming to the polymer 411 are conveyed to the solar cells 412 and 413 and are converted into electrical energy by the solar cells 412 and 413.

Figure 5A:
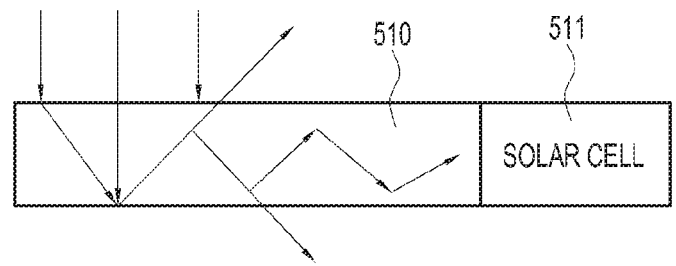
FIGS. 5A and 5B are diagrams illustrating a process for transmitting light in a polymer.

FIG. 5A is a diagram illustrating an example of a process for transmitting light in a polymer. Referring to FIG. 5A, photons may be incident from the outside to a polymer 510. The polymer 510 of FIG. 5A may be at least one of the polymers shown in, e.g., FIGS. 2A to 2C, 3, and 4. In an example, some of the incident photons are reflected in the polymer 510 and then transmitted to the outside of the polymer 510, and others are delivered to the solar cell 511.

Figure 5B:
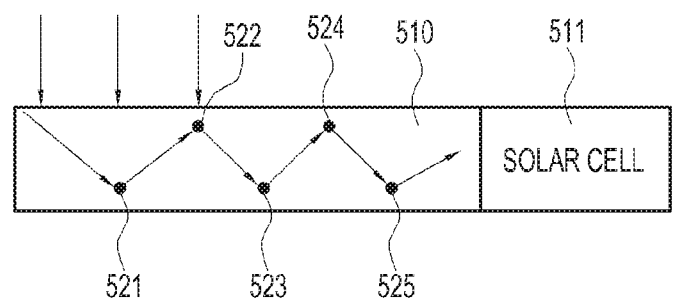
Figure 5C:
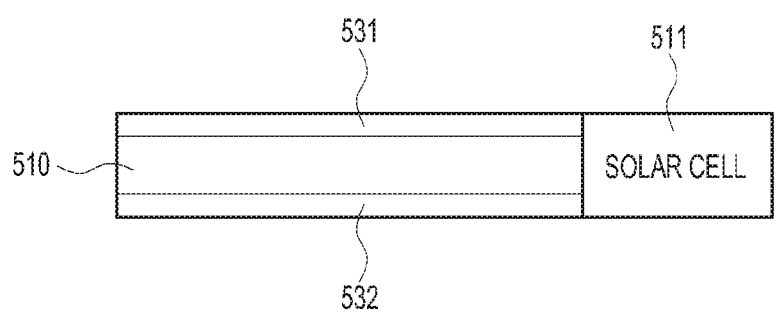
FIG. 5C is a diagram illustrating an example of a polymer and a solar cell.

FIG. 5B is a diagram illustrating an example of a process for transmitting light in a polymer. The polymer 510 of FIG. 5B is one of the polymers shown in, e.g., FIGS. 2A to 2C, and 3 to 5A. Referring to FIG. 5B, in an example, the polymer 510 includes quantum dots 521, 522, 523, 524, and 525. Because of their relatively small size, the quantum dots 521, 522, 523, 524, and 525 do not influence the transmittance of the polymer 510. The quantum dots 521, 522, 523, 524, and 525 may absorb and emit back photons or may reflect photons, allowing more photons to reach the solar cell 511 than in existing technology. In an example, the polymer 510 is formed of ferroelectrics. The ferroelectrics may have the property of spontaneous polarization. For example, the electronic device 101 may further include potential generating layers 531 and 532 on the top and bottom of the polymer 510 as shown in FIG. 5C. As the electronic device 101 applies potentials to the potential generating layers 531 and 532, the potential generating layers 531 and 532 may produce electric potentials. Electric potentials may also be produced by, e.g., friction between at least one of the potential generating layers 531 and 532 and another object (e.g., a human body). For example, the energy converting layer 223 as shown in FIG. 2A may be implemented as the potential generating layer 532 in which case the potential generating layer 532 may be disposed only on the bottom of the polymer 510. Further, where the polymer 510 is formed of a ferroelectric, an electric potential may be produced inside the ferroelectric even without the potential generating layers 531 and 532.

Figure 5D:
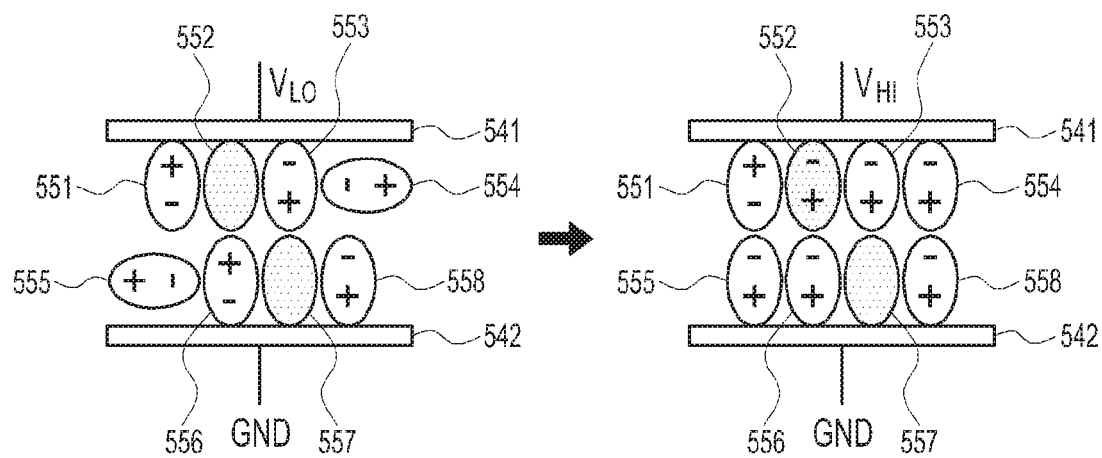
FIG. 5D is a diagram illustrating example of an alignment of molecules in a polymer.

As an electric potential is produced by the potential generating layers 531 and 532, the molecules in the polymer 510 may be aligned as shown in FIG. 5D. It can be seen in FIG. 5D that the molecules 551, 552, 553, 554, 555, 556, 557, and 558 in the polymer 510 are aligned in different forms when a relatively low voltage ($V_{LO}$) is applied between the surfaces 541 and 542. When a relatively high voltage ($V_{HI}$) is applied, as seen in FIG. 5D, the molecules 551, 552, 553, 554, 555, 556, 557, and 558 in the polymer 510 are aligned. Thus, electric potentials may be produced around the quantum dots 521, 522, 523, 524, and 525 inside the ferroelectric. Even after the application of the high voltage $V_{HI}$ to the ferroelectric is stopped, the molecules 551, 552, 553, 554, 555, 556, 557, and 558 may remain aligned in the ferroelectric.

As the potentials are formed around the quantum dots 521, 522, 523, 524, and 525, the electromagnetic level is varied to shift the light absorption wavelength, thus raising the light absorption efficiency. For example, a shift in light absorption wavelength from 520 nm to 526 nm may increase the light absorption efficiency by 15%. Accordingly, more photons may be delivered to the solar cell 511. When the energy level of the quantum dots is varied by the electric potential applied to the outside of the quantum dots, the photoluminescence emission spectrum may be varied, expanding the energy band.

Figure 6:
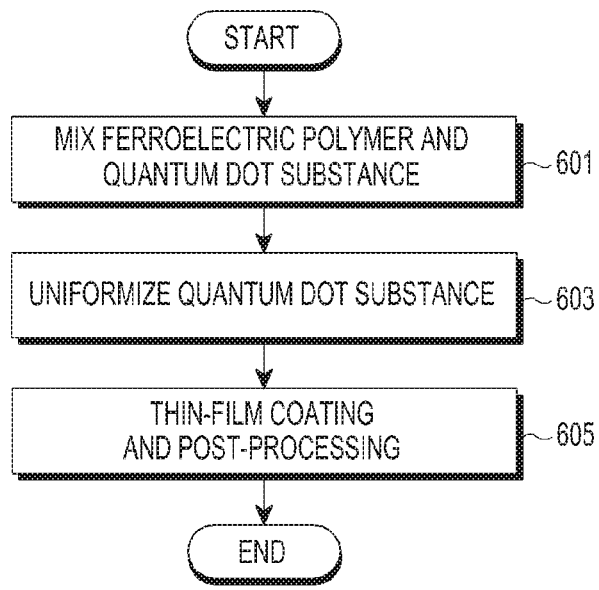
FIG. 6 is a diagram illustrating example of a process for manufacturing a polymer including quantum dots.

FIG. 6 is a diagram illustrating an example of a process for manufacturing a polymer including quantum dots. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. One or more blocks of FIG. 6, and combinations of the blocks, can be implemented by special purpose hardware-based computer that perform the specified functions, or combinations of special purpose hardware and computer instructions. In addition to the description of FIG. 6 below, the descriptions of FIGS. 1-5C are also applicable to FIG. 6, and are incorporated herein by reference. Thus, the above description may not be repeated here.

In operation 601, a ferroelectric polymer and a quantum dot substance may be mixed. For example, a solution in which a P (VDF-TrFE) ferroelectric polymer is dissolved in a DMF solvent may be mixed with a solution in which CdSe for forming quantum dots is dissolved in a toluene solvent, thereby forming a mixture of the ferroelectric polymer and the quantum dot substance. In an example, the mixture is coated on a plate and is then evaporated and/or thermally treated. Further, a poling may be performed by applying a voltage while varying the voltage from, e.g., 100V to, e.g., 500V. In operation 602, after the coating, the quantum dot substance may be uniformized. For example, a dispersity enhancing process may be performed by adjusting the composition of the solvent and the chemical potential to enhance the uniformity and wettability. For example, the molecular bonding energy may be adjusted, and the dispersity of quantum dots may be enhanced using sonication or adding a solvent (MEK).

In operation 605, the dispersity enhancing process may be followed by thin film coating and post-processing. For example, coating may be performed based on a polar control solvent, followed by post-processing, e.g., thermal treatment. The physical properties of the film may be determined depending on coating conditions. The film that builds up may be, e.g., 10 μm to 100 μm thick, but are not limited thereto. In an example, a polymer may be produced in a structure of a stack of multiple films. For example, as the film thickens, the deviation between the quantum dots may increase. Thus, the polymer may be produced in a structure where a plurality of films are stacked one over another to keep the quantum dots at a good degree of dispersity in the film. The stacked structure of polymer may have a relatively low poling voltage (e.g., 60V/μm) which advantageously work for a poling process.

Figure 7:
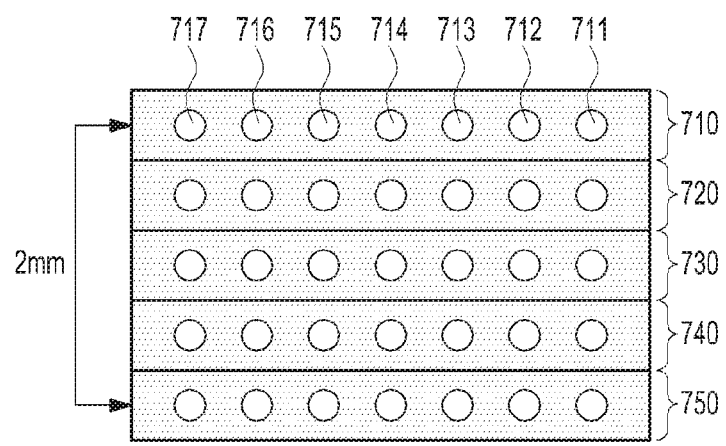
FIG. 7 is a diagram illustrating an example of a polymer in a stack structure.

FIG. 7 is a diagram illustrating an example of a polymer in a stack structure. Referring to FIG. 7, one film 710 includes quantum dots 711 to 717 with a relatively good degree of dispersity. In an example, a plurality of films 710 to 750 with quantum dots are stacked one over another.

Figure 8:
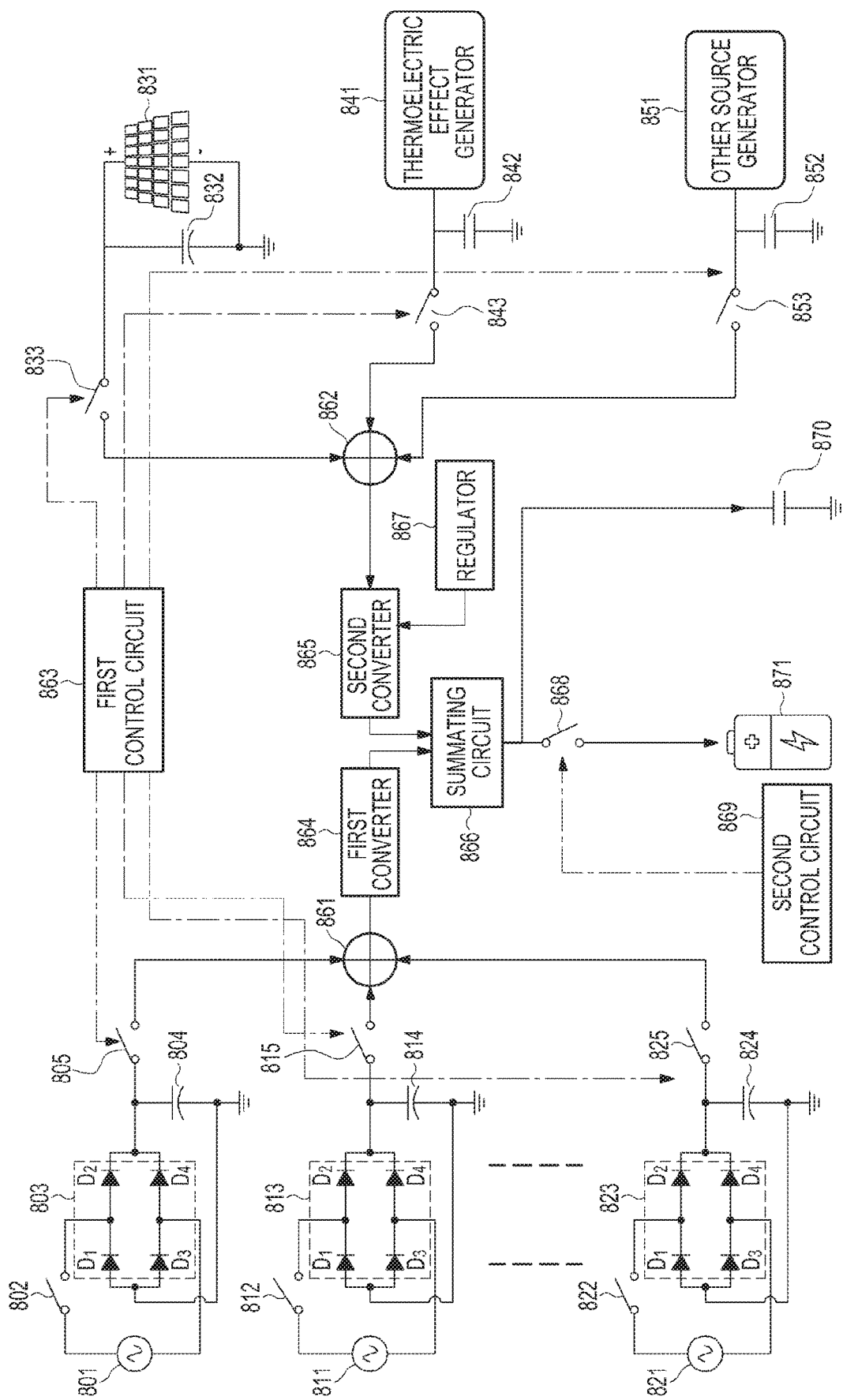
FIG. 8 is a diagram illustrating an example of a configuration of an electronic device.

FIG. 8 is a diagram illustrating an example of a configuration of an electronic device.

Referring to FIG. 8, an electronic device 101 may include at least one of a tribo-electric generator 801, a piezo effect generator 811, a magnetic field converting module 821, a solar cell 831, a thermoelectric effect generator 841, and other source generator 851.

The tribo-electric generator 801 may be connected to a switch 802, and the switch 802 may be connected to a rectifying circuit 803. Although the rectifying circuit 803 is implemented in the form of bridged diodes, this is merely an example, and the rectifying circuit 803 is not limited to a particular implementation. In an example, the rectifying circuit 803 converts AC electrical energy generated from the tribo-electric generator 801 into DC electrical energy and outputs the DC electrical energy. The rectifying circuit 803 may be connected to a capacitor 804 and a switch 805. The capacitor 804 may store the rectified electrical energy when the switch 805 is off. When the switch 805 is controlled to turn on, electrical energy rectified by the rectifying circuit 803 or electrical energy stored in the capacitor 804 may be delivered to a first converter 864. For example, the electrical energy from the rectifying circuit 803 and the electrical energy from at least one of the rectifying circuit 813 or the rectifying circuit 823 may be added (861) and delivered to the first converter 864.

In an example, a first control circuit 863 controls the state of the switch 805 based on whether the property of the electrical energy from the tribo-electric generator 801 meets a designated condition. For example, a sensor (not shown) may measure the voltage at the output end of the rectifying circuit 803 or the voltage at the output end of the tribo-electric generator 801 and transfer the measurement to the first control circuit 863. Upon determining that the voltage received from the sensor exceeds the threshold (e.g., 10V), the first control circuit 863 may control the switch 805 to turn on. Upon determining that the voltage is less than the threshold, the first control circuit 863 may control the switch 805 to turn off. The switch 802 may be turned on/off under the control of, e.g., the first control circuit 863. In an example, even where the switch 805 is off, the switch 802 may be on. In this case, the electrical energy from the tribo-electric generator 801 is stored in the capacitor 804. For example, the switch 802 may be set to turn on upon determining that electrical energy is generated from the tribo-electric generator 801 or a friction occurs. In an example, the switch 802 may not be included in the electronic device 101.

The switches 812 and 822 may be operated similar to the switch 802. The rectifying circuits 813 and 823 may be operated similar to the rectifying circuit 803. The capacitors 814 and 824 may be operated similar to the capacitor 804. The switches 815 and 825 may be operated similar to the switch 805. In an example, each of the rectifying circuits 803, 813, and 823 may be set to have an optimal efficiency at the magnitude of electrical energy output from the power source, and accordingly, the rectifying circuits 803, 813, and 823 may have their optimal efficiency at different input currents. Although FIG. 8 illustrates an example in which the power sources 801, 811, and 813 are connected to their respective corresponding rectifying circuits 803, 813, and 823, this is merely an example. For example, at least some of the power sources 801, 811, and 813 may share a rectifying circuit.

The respective switch control conditions of the power sources (e.g., 801, 811, 821, 831, 841, and 851) may be the same or at may differ from each other. For example, a turn-on condition for the switch 805 corresponding to the tribo-electric generator 801 may be the voltage output from the tribo-electric generator 801 being 10V or more, and a turn-on condition for the switch 815 corresponding to the piezo effect generator 811 may be the voltage output from the piezo effect generator 811 being 3V or more. In other words, a threshold to determine whether to turn on the switch may be set to differ per power source.

In an example, the solar cell 831, the thermoelectric effect generator 841, or the other source generator 851 may generate and output DC electrical energy. Thus, no rectifying circuit may be connected to the solar cell 831, the thermoelectric effect generator 841, or the other source generator 851. A capacitor 832 and a switch 833 may be connected to the solar cell 831. A capacitor 842 and a switch 843 may be connected to the thermoelectric effect generator 841. A capacitor 852 and a switch 853 may be connected to the other source generator 851. Where the switch 833 is off, the capacitor 832 may store rectified electrical energy. When the switch 833 is controlled to turn on, rectified electrical energy from the solar cell 831 or electrical energy stored in the capacitor 832 may be delivered to a second converter 865. For example, the electrical energy from the solar cell 831 and the electrical energy from at least one of the thermoelectric effect generator 841 or the other source generator 851 may be added (862) and delivered to the second converter 865. The first control circuit 863 may control the state of the switch 833 based on whether the property of the electrical energy from the solar cell 831 meets a designated condition. For example, a sensor (not shown) may measure the voltage at the output end of the solar cell 831 and transfer the measurement to the first control circuit 863. Upon determining that the voltage received from the sensor exceeds the threshold (e.g., 3V), the first control circuit 863 may control the switch 833 to turn on, and upon determining that the voltage is less than the threshold, the first control circuit 863 may control the switch 833 to turn off. The switches 843 and 853 may be operated similar to the switch 833, and the capacitors 842 and 852 may be operated similar to the capacitor 832.

The first converter 864 may convert the voltage of the electrical energy generated by one or more of the tribo-electric generator 801, the piezo effect generator 811, or the magnetic field converting module 821 and rectified and output the voltage to a summating circuit 866. The second converter 864 may convert the voltage of the electrical energy generated by one or more of the solar cell 831, the thermoelectric effect generator 841, or the other source generator 851 and output the converted voltage to the summating circuit 866. In an example, the electronic device 101 may include a regulator 867. The converted voltage may be regulated and output to the summating circuit 866. The summating circuit 866 may deliver the summated electrical energy to the battery 871 or a storage capacitor 870. When the switch 868 is controlled to turn on, the electrical energy summated by the summating circuit 866 may be delivered to the battery 871, charging the battery 871. Where the switch 868 is off, the electrical energy summated by the summating circuit 866 may be stored in the storage capacitor 870. The energy stored in the storage capacitor 870 may be transferred to the battery 871 when the switch 868 is on. The second control circuit 869 may control the switch 868 to turn on when an identified property, e.g., voltage at the summating circuit 866, meets a condition. For example, where the voltage of the summated electrical energy exceeds 4.2V, the second control circuit 869 may control the switch 868 to turn off, preventing a high voltage from being applied to the battery 871. Where the voltage of the summated electrical energy is 42V or less, the second control circuit 869 may control the switch 868 to turn on. In an example, the second control circuit 869 may be implemented independent from the first control circuit 863. In another example, the second control circuit 869 and the first control circuit 863 may be implemented in a single control circuit.

Figure 9:
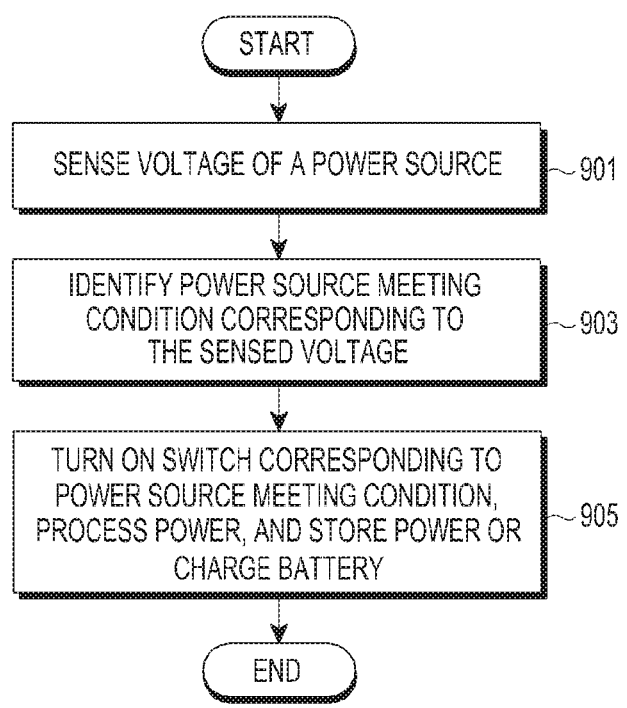
FIG. 9 is a diagram illustrating an example of a method for operating an electronic device.

FIG. 9 is a diagram illustrating an example of a method for operating an electronic device. The operations in FIG. 9 may be performed in the sequence and manner as shown, although the order of some operations may be changed or some of the operations omitted without departing from the spirit and scope of the illustrative examples described. Many of the operations shown in FIG. 9 may be performed in parallel or concurrently. One or more blocks of FIG. 9, and combinations of the blocks, can be implemented by special purpose hardware-based computer that perform the specified functions, or combinations of special purpose hardware and computer instructions. In addition to the description of FIG. 9 below, the descriptions of FIGS. 1-8 are also applicable to FIG. 9, and are incorporated herein by reference. Thus, the above description may not be repeated here.

In an example, in operation 901, the electronic device 101 may sense at least one power source voltage. In operation 903, the electronic device 101 may identify power sources meeting a condition corresponding to each sensed voltage. The condition may be set for each power source. In operation 905, the electronic device 101 may turn on the switch corresponding to the power source meeting the condition and process power, storing the power or charging the battery. The electronic device 101 may turn off the switch corresponding to the power source failing to meet the designated condition.

As used herein, "electronic device 101 performs a particular operation" may be appreciated as the processor 120 performing the particular operation. As used herein, "electronic device 101 performs a particular operation" may also be appreciated as the processor 120 controlling hardware in the electronic device 101 or hardware outside the electronic device 101 to perform the particular operation. Further, "electronic device 101 performs a particular operation" may be appreciated as the memory 130 storing instructions enabling at least one of the processor 120 or hardware to perform the particular operation.

Figure 10:
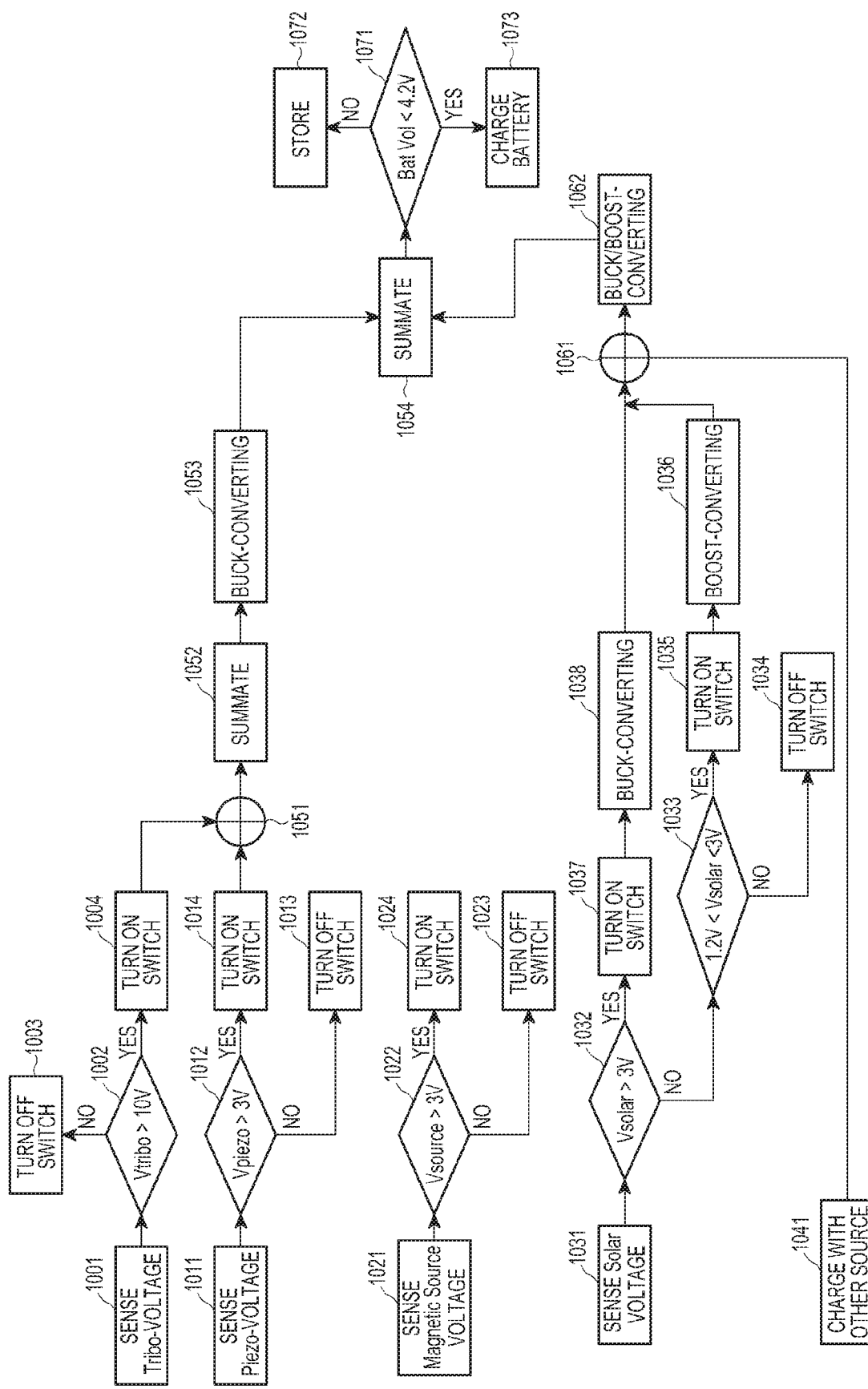
FIG. 10 is a diagram illustrating an example of a method for operating an electronic device.

FIG. 10 is a diagram illustrating an example of a method for operating an electronic device. The operations in FIG. 10 may be performed in the sequence and manner as shown, although the order of some operations may be changed or some of the operations omitted without departing from the spirit and scope of the illustrative examples described. Many of the operations shown in FIG. 10 may be performed in parallel or concurrently. One or more blocks of FIG. 10, and combinations of the blocks, can be implemented by special purpose hardware-based computer that perform the specified functions, or combinations of special purpose hardware and computer instructions. In addition to the description of FIG. 10 below, the descriptions of FIGS. 1-9 are also applicable to FIG. 10, and are incorporated herein by reference. Thus, the above description may not be repeated here.

In operation 1001, the electronic device 101 may sense a voltage (or rectified voltage) output from the tribo-electric generator. In operation 1002, the electronic device 101 may identify whether the voltage output from the tribo-electric generator exceeds a threshold (e.g., 10V) corresponding to the tribo-electric generator. In an example, when the voltage output from the tribo-electric generator is determined to be 10V or less, the electronic device 101 may turn off the switch corresponding to the tribo-electric generator in operation 1003. When the voltage output from the tribo-electric generator is determined to exceed 10V, the electronic device 101 may turn on the switch corresponding to the tribo-electric generator in operation 1004.

In operation 1031, the electronic device 101 may sense a voltage output from the solar cell. In operation 1032, the electronic device 101 may identify whether the voltage output from the solar cell exceeds a threshold (e.g., 3V) corresponding to the solar cell. In an example, when the voltage output from the solar cell is determined to be 3V or less, the electronic device 101 may identify whether the voltage output from the solar cell exceeds 1.2V and is not more than 3V in operation 1033. In an example, when the voltage output from the solar cell is determined to be less than 1.2V, the electronic device 101 may turn off the switch corresponding to the solar cell in operation 1034. In an example, when the voltage output from the solar cell is determined to be more than 1.2V and not more than 3V, the electronic device 101 may turn on the switch corresponding to the solar cell in operation 1035. In operation 1036, the electronic device 101 may boost-convert the voltage output from the solar cell. When the voltage output from the solar cell is identified to be more than 3V, the electronic device 101 may turn on the switch corresponding to the solar cell in operation 1037. In operation 1038, the electronic device 101 may buck-convert the voltage output from the solar cell.

In operation 1041, the electronic device 101 performs charging by other source. In operation 1051, the electronic device 101 may summate electrical energy from the tribo-electric generator and electrical energy from the piezo effect generator. In operation 1053, the electronic device 101 may perform buck-converting and output. In operation 1061, the electronic device 101 may summate electrical energy from the solar cell and electrical energy from the other source. In operation 1062, the electronic device 101 may perform buck-converting or boost-converting. In operation 1054, the electronic device 101 may summate both the electrical energy levels. In operation 1071, in an example, the electronic device 101 may identify whether the voltage of the summated electrical energy is 4.2V or less. In an example, when the voltage of the summated electrical energy is 4.2V or more, the electronic device 101 may store the summated electrical energy in operation 1072. In an example, when the voltage of the summated electrical energy is less than 4.2V, the electronic device 101 may charge the battery with the summated electrical energy in operation 1073.

There is provided an electronic device, and a method for operating the same, that permit harvesting for power sources meeting a designated condition. There may also be provided an electronic device, and a method for operating the same, that may harvest power by photoelectrically converting light gathered ambient accessories as well as the electronic device, thereby increasing the light collecting area.

The devices, controllers, apparatuses, units, modules, devices, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 6 and 9-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the method of preventing the collision. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processor or computer.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device, comprising:
a plurality of energy converting modules, each of the energy converting modules configured to generate a respective pieces of electrical energy;
at least one sensor configured to sense respective magnitudes of the pieces of electrical energy generated by the each of the energy converting modules;
at least one converter configured to convert voltages of the pieces of electrical energy;
first switches, each of the first switches configured to selectively connect one of the energy converting modules to one of the at least one converter;
a summating circuit configured to summate the pieces of electrical energy output from the at least one converter;
a second switch configured to connect the summating circuit to a battery; and
at least one processor configured to:
receive the respective magnitudes of the pieces of electrical energy from the at least on sensor,
identify whether each of the respective magnitudes of the pieces of electrical energy meets a respective one of a plurality of thresholds, each of the plurality of thresholds corresponding to a respective type of a respective energy converting module, and
control an on/off operation of the each of the first switches based on a result of the identification, and
in response to the summated electric energy being larger than a preset value, turn off the second switch to prevent the summated electric energy from being applied to the battery.

2. The electronic device of claim 1, further comprising a memory configured to store the plurality of the thresholds.

3. The electronic device of claim 1, wherein the electronic device is a watch-type electronic device, wherein the watch-type electronic device comprises a strap, and the strap comprises a polymer.

4. The electronic device of claim 3, wherein the watch-type electronic device comprises a crown, and a rotations of the crown delivers electrical energy to a second energy converting module, and the plurality of energy converting modules comprises the second energy converting module.

5. The electronic device of claim 1, wherein the electronic device is a smartphone, wherein a polymer is disposed on a display of the smartphone.

6. The electronic device of claim 5, wherein the solar cell is disposed on a first end of the polymer and on a second end of the polymer.

7. The electronic device of claim 1, wherein the plurality of energy converting modules comprises a tribo-electric generator, a piezo effect generator, a photoelectric module, and a magnetic field converting module.

8. The electronic device of claim 7, wherein the plurality of thresholds include a first threshold for the tribo-electric generator, a second threshold for the piezo effect generator, and the first threshold is different from the second threshold.

9. The electronic device of claim 1, wherein the thermo-electric effect generator is based on a Seebeck effect.

* * * * *